US009231085B2

(12) United States Patent
Anderson et al.

(10) Patent No.: US 9,231,085 B2
(45) Date of Patent: Jan. 5, 2016

(54) SEMICONDUCTOR STRUCTURE AND METHODS OF MANUFACTURE

(75) Inventors: Brent A. Anderson, Jericho, VT (US); Edward J. Nowak, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 295 days.

(21) Appl. No.: 13/403,457

(22) Filed: Feb. 23, 2012

(65) Prior Publication Data

US 2012/0146145 A1    Jun. 14, 2012

Related U.S. Application Data

(63) Continuation of application No. 12/909,325, filed on Oct. 21, 2010, now Pat. No. 8,211,759.

(51) Int. Cl.
*H01L 29/76* (2006.01)
*H01L 29/66* (2006.01)
*H01L 21/265* (2006.01)
*H01L 29/78* (2006.01)

(52) U.S. Cl.
CPC .... *H01L 29/66795* (2013.01); *H01L 21/26586* (2013.01); *H01L 29/66803* (2013.01); *H01L 29/785* (2013.01)

(58) Field of Classification Search
None
See application file for complete search history.

(56) References Cited

U.S. PATENT DOCUMENTS

| | | |
|---|---|---|
| 6,265,291 B1 | 7/2001 | Yu et al. |
| 6,921,700 B2 | 7/2005 | Orlowski et al. |
| 6,962,843 B2 | 11/2005 | Anderson et al. |
| 7,026,199 B2 | 4/2006 | Lee |
| 7,074,660 B2 | 7/2006 | Manger |
| 7,510,939 B2 | 3/2009 | Furukawa et al. |
| 7,566,613 B2 | 7/2009 | Furukawa et al. |
| 7,638,381 B2 | 12/2009 | Cheng et al. |

(Continued)

FOREIGN PATENT DOCUMENTS

KR    100763542 B1    10/2007

OTHER PUBLICATIONS

W.Wu et al. "Analysis of Geometry-Dependent Parasitics in Multifin Double-Gate FinFETs", IEEE Transactions on Electron Devices, vol. 54, No. 4, Apr. 2007, pp. 692-698.

(Continued)

*Primary Examiner* — Evan Pert
*Assistant Examiner* — Shaka White
(74) *Attorney, Agent, or Firm* — Michael Le Strange; Andrew M. Calderon; Roberts Mlotkowski Safran & Cole, P.C.

(57) ABSTRACT

FinFET end-implanted-semiconductor structures and methods of manufacture are disclosed herein. The method includes forming at least one mandrel on a silicon layer of a substrate comprising an underlying insulator layer. The method further includes etching the silicon layer to form at least one silicon island under the at least one mandrel. The method further includes ion-implanting sidewalls of the at least one silicon island to form doped regions on the sidewalls. The method further includes forming a dielectric layer on the substrate, a top surface of which is planarized to be coplanar with a top surface of the at least one mandrel. The method further includes removing the at least one mandrel to form an opening in the dielectric layer. The method further includes etching the at least one silicon island to form at least one fin island having doped source and drain regions.

17 Claims, 9 Drawing Sheets

(56) References Cited

U.S. PATENT DOCUMENTS

| | | | |
|---|---|---|---|
| 7,795,907 B1* | 9/2010 | Wang | 326/36 |
| 2003/0193058 A1* | 10/2003 | Fried et al. | 257/200 |
| 2004/0262690 A1 | 12/2004 | Coronel et al. | |
| 2005/0093154 A1 | 5/2005 | Kottantharayil et al. | |
| 2006/0006466 A1* | 1/2006 | Iinuma | 257/347 |
| 2006/0189043 A1 | 8/2006 | Schulz | |
| 2006/0216880 A1* | 9/2006 | Suto | 438/197 |
| 2007/0004117 A1* | 1/2007 | Yagishita | 438/197 |
| 2007/0111454 A1* | 5/2007 | Yeo et al. | 438/283 |
| 2008/0099849 A1 | 5/2008 | Kim et al. | |
| 2008/0149593 A1 | 6/2008 | Bai et al. | |
| 2008/0222227 A1* | 9/2008 | Chiang | 708/209 |
| 2009/0020819 A1* | 1/2009 | Anderson et al. | 257/365 |
| 2009/0230478 A1 | 9/2009 | Pillarisetty et al. | |
| 2009/0302402 A1 | 12/2009 | Anderson et al. | |
| 2010/0038679 A1 | 2/2010 | Chan et al. | |

OTHER PUBLICATIONS

E.J. Nowak et al. "Turning Silicon on its Edge", IEEE Circuits and Devices Magazine, vol. 20, No. 1, Feb. 2004, pp. 20-31.

Examination Report in U.K. Application No. GB1307733.4, dated Jan. 21, 2014; 2 Pages.

* cited by examiner

SEMICONDUCTOR STRUCTURE AND METHODS OF MANUFACTURE

CROSS REFERENCE TO RELATED APPLICATIONS

The present application is a continuation application of copending U.S. application Ser. No. 12/909,325, filed on Oct. 21, 2010, the contents of which are incorporated by reference in their entirety herein.

FIELD OF THE INVENTION

The invention relates to semiconductor structures and methods of manufacture and, more particularly, to finFET end-implanted-semiconductor strap and methods of manufacture.

BACKGROUND

The geometry of the components making up multi-fin double-gate fin field-effect transistors (FinFETs) can lead to complications during manufacture. For example, doping of extensions in FinFETs is complicated by a shadowing affect of blocking resists when using conventional angled ion implantation. Specifically, the aspect ratio of the blocking resist thickness to fin spacing causes problems with shadowing the sides of the structure during ion implantation. This shadowing affect can lead to limited circuit density.

Conventional solutions include the use of a chevron layout of the fins with tilted implants at twist directions nearly orthogonal to the gate, and implanting end-etched fins at twist angles near orthogonal to the gate. The former conventional method is limited to chevron layout schemes, whereas the latter conventional method is dependent on fin expansion with selective silicon on very small structures, which can be very challenging.

Accordingly, there exists a need in the art to overcome the deficiencies and limitations described hereinabove.

SUMMARY

In a first aspect of the invention, a method comprises forming at least one mandrel on a silicon layer of a substrate comprising an underlying insulator layer. The method further comprises etching the silicon layer to form at least one silicon island under the at least one mandrel. The method further comprises ion-implanting sidewalls of the at least one silicon island to form doped regions on the sidewalls. The method further comprises growing epitaxial material on the doped sidewall regions. The method further comprises forming a dielectric layer on the substrate, a top surface of which is planarized to be coplanar with a top surface of the at least one mandrel. The method further comprises removing the at least one mandrel to form an opening in the dielectric layer. The method further comprises etching the at least one silicon island to form at least one fin island having doped source and drain regions.

In another aspect of the invention, a method comprises forming a plurality of sacrificial structures on a silicon film of a substrate. The method further comprises selectively etching the silicon film to form a plurality of discrete islands separated by a trench. The method further comprises forming doped regions on sidewalls of the silicon film. The method further comprises forming epitaxial material on the doped regions on the sidewalls of the silicon film. The method further comprises removing the plurality of sacrificial structures on the silicon film and etching trenches into the silicon islands to form discrete fin structures. The method further comprises forming gate dielectric material and gate electrode material over the discrete fin structures to form discrete finFETs having source and drain regions on ends thereof formed by the doped regions.

In yet another aspect of the invention, a structure comprises a plurality of spaced apart single-crystal silicon fins. The structure further comprises a doped single-crystal silicon source abutting one end of the plurality of spaced apart single-crystal silicon fins and a doped single-crystal silicon drain abutting another end of the plurality of spaced apart single-crystal silicon fins. The structure further comprises an epitaxial silicon contact abutting the doped single-crystal silicon source and drain.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the finFET structures, which comprises the structures of the present invention. In still further embodiments, a method in a computer-aided design system is provided for generating a functional design model of the finFET structures. The method comprises generating a functional representation of the structural elements of the finFET structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 1, 2a, 2b, 3, 4a and 4b-10 show processing steps and respective structures for building dense finFET structures with self aligned extensions in accordance with aspects of the present invention.

DETAILED DESCRIPTION

The invention relates to semiconductor structures and methods of manufacture and, more particularly, to finFET end-implanted-semiconductor strap and methods of manufacture. More specifically, the present invention provides dense finFET structures with self aligned extensions and methods of manufacture. In embodiments, the method of the present invention includes implanting an end block of silicon and etching fins within the block prior to gate formation of the finFET. This advantageously allows for the formation of dense finFET integration with self-aligned extensions. In embodiments, the finFETs can have a single crystalline structure, which provides lower resistance structures, compared to conventional finFET structures. This is possible due to the implant process for formation of source and drain regions being performed at a steep angle and lower dose and energy, compared to conventional build methods. This is possible due to the elimination of a blocking mask and/or fins adjacent that would typically block the dopant from implanting into the underlying silicon at a steep angle.

Figure 1:
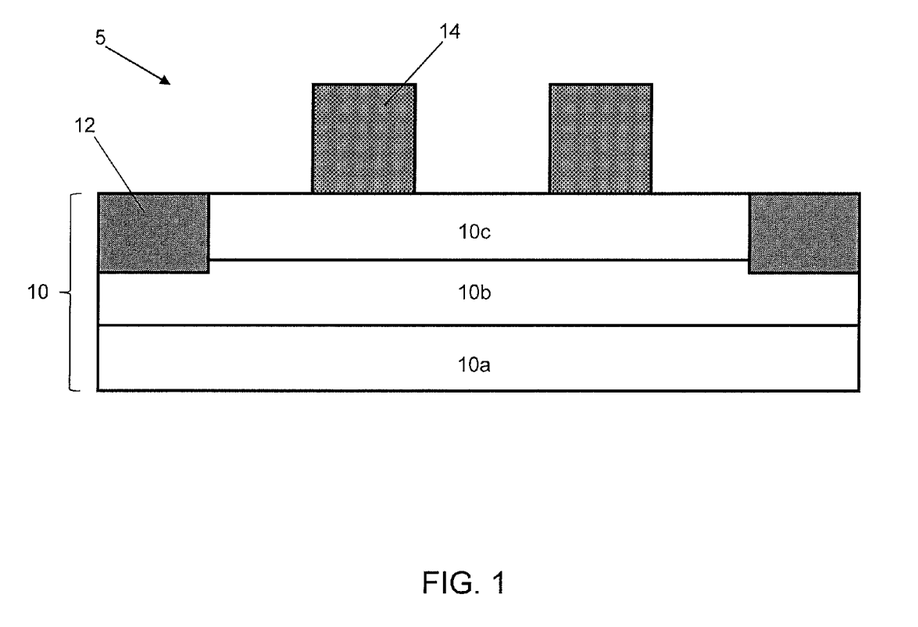

FIG. 1 shows processing steps and resultant structure in accordance with aspects of the invention. FIG. 1 shows a structure 5 comprising a wafer 10. In embodiments, the wafer 10 can be, for example, BULK or silicon on insulator (SOI). In the SOI implementation, an oxide or other isolation region 10b is sandwiched between a silicon layer 10a and a silicon film 10c. In the BULK implementation, reference numeral 10b can be representative of any isolation region or junction isolation. In embodiments, a shallow trench isolation structure (STI) 12 is formed in the wafer 10. The STI 12 can be formed in any conventional manner, such as, for example, photolithographic and etching processes. In embodiments, the STI 12 includes oxide.

A plurality of sacrificial structures (e.g., mandrels) 14 are formed on the wafer 10, and in particular, on the silicon film 10c. The sacrificial structures 14 are sacrificial structures that are formed by depositing a material on the wafer 10 and patterning the material using conventional patterning techniques such as, for example, reactive ion etching (RIE) techniques, known to those of skill in the art. In embodiments, the sacrificial structures 14 can be composed of silicon nitride, a silicon oxide or of polysilicon, or a suitable stack of these materials. In further embodiments, the sacrificial structures 14 are formed of a different material than the underlying film 10c. In embodiments, the sacrificial structures 14 are about 8 nm to about 25 nm in width, about 60 nm to about 600 nm in height, and about 50 nm to about 300 nm in length, depending on the design of the gate structures.

Figure 2A:
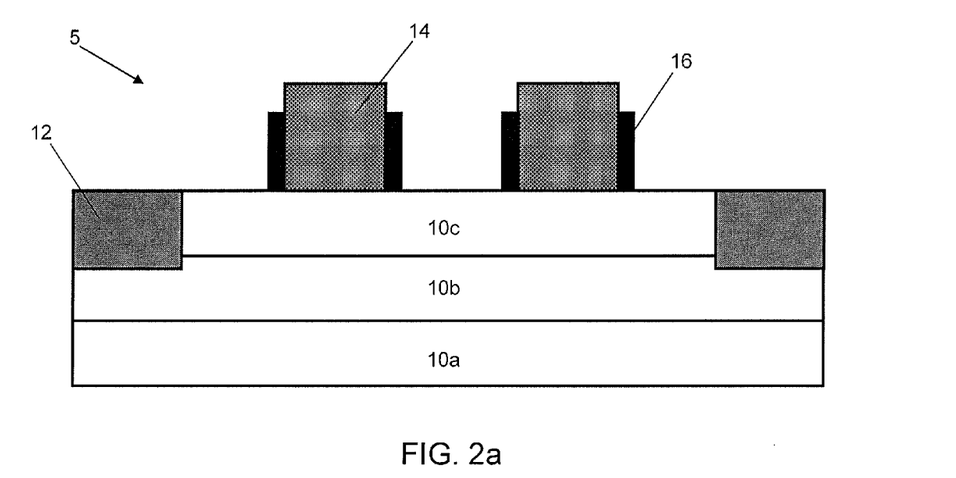
Figure 2B:
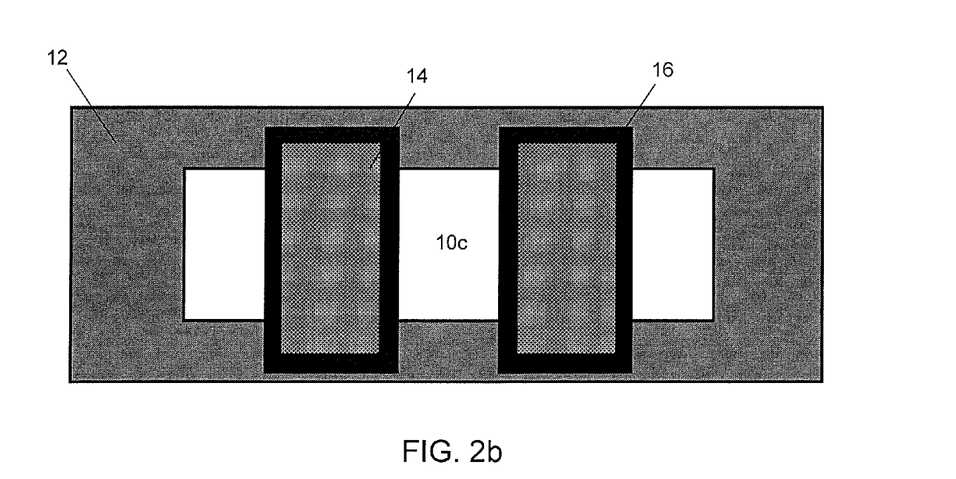

FIG. 2a shows additional processing steps and resultant structure in accordance with aspects of the invention. FIG. 2b shows a top view of the structure of FIG. 2a. In embodiments, a conformal material is formed on the sacrificial structures 14 to form sidewall structures 16. The conformal material can be formed by depositing the material on the sacrificial structures 14 and the exposed surfaces of the structure (e.g., STI 12 and film 10c). In embodiments, the conformal material can be SiN or $SiO_2$, for example. In embodiments, the conformal material can be other materials such as, for example, a combination of SiN and $SiO_2$. In further embodiments, an isotropic etching process is performed to form the sidewall structures (e.g., spacers) 16 on sides of the sacrificial structures 14. In embodiments, the isotropic etching exposes a top portion of the sacrificial structures 14. The sidewall structures 16 can be approximately 1.5 nm to about 5 nm, but are preferably sized to allow for the final implanted source and drain to under-diffuse the final gate electrode by about 10% of the physical gate length that will form a finFET.

Figure 3:
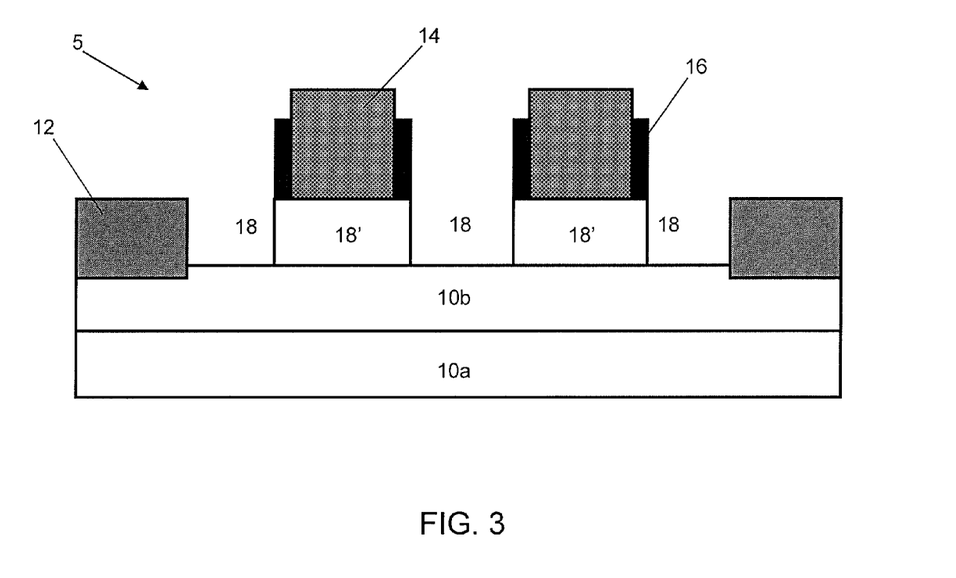

FIG. 3 shows additional processing steps and resultant structure in accordance with the aspects of the present invention. As shown in FIG. 3, trenches 18 are formed on the sides of the sacrificial structures 14. The trenches 18 form silicon islands 18' which can be, approximately, 15-35 nm in height and 7-30 nm in width. In embodiments, the silicon islands 18' will have a same dimension as the sidewall structures 16 and sacrificial structures 14. For example, the length of the silicon islands 18' can be approximately 50 nm to 300 nm, which provides ample latitude for recrystallization during the annealing process of a finFET. In embodiments, the trenches 18 are formed by a directional etch having a chemistry which selectively removes exposed portions of the silicon film 10c, e.g., the silicon film 10c that is not protected by the sacrificial structures 14 and sidewall structures 16. In embodiments, the sacrificial structures 14 are not the same material as the underlying film in order to ensure that the sacrificial structures 14 are not removed during the directional etching process.

Figure 4A:
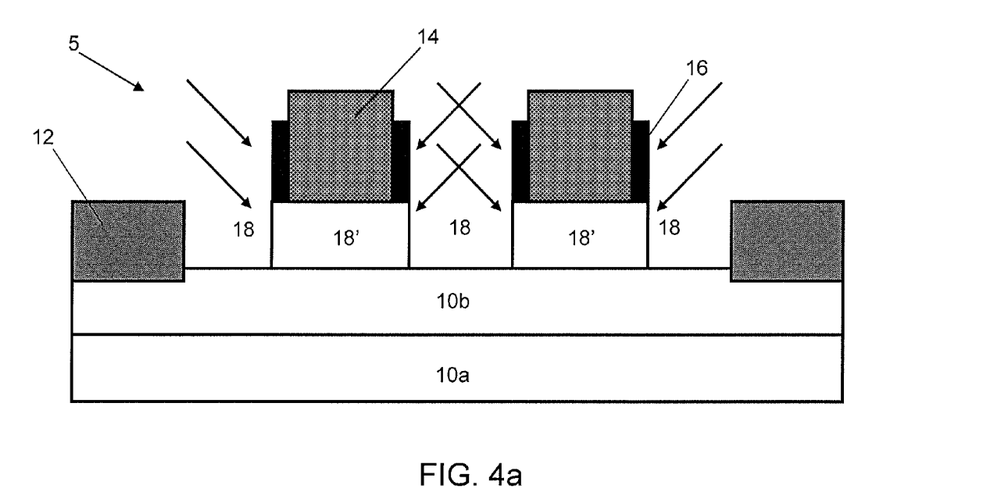
Figure 4B:
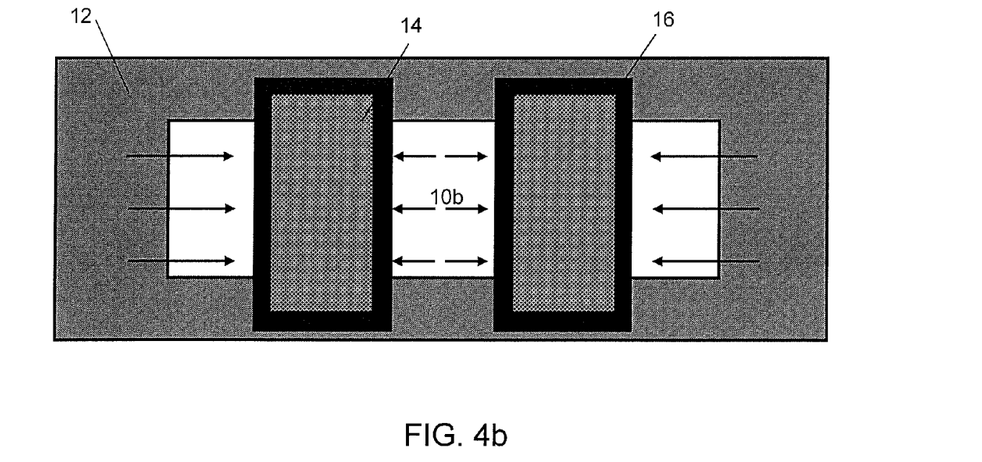

FIG. 4a shows additional processing steps and resultant structure in accordance with aspects of the present invention. FIG. 4b is a top view of the structure of FIG. 4a. As shown in FIGS. 4a and 4b, the silicon islands 18' are subjected to an implant process on exposed sidewalls (first and second, opposite sidewalls) to form, for example, nFETs or pFETs. In embodiments, the nFETs can be doped with arsenic or phosphorous; whereas, the pFETs can be doped with boron. Due to many factors such as, for example, the direction of the implant, the elimination of a blocking mask or an adjacent finFET blocking the implants, it is now possible to provide a lower dose and energy at a steeper angle than with conventional implant processes. Advantageously, the implant process will thus minimize any damage to the silicon islands 18', e.g., ensures that the crystal lattice of the Si islands 18' is minimally disrupted by ion implantation. This, in turn, ensures that the silicon of the silicon islands 18' can recrystallize during the subsequent annealing process of the formation of the finFET. In this way, advantageously, the finFETS can be formed from a single crystalline silicon.

Figure 5:
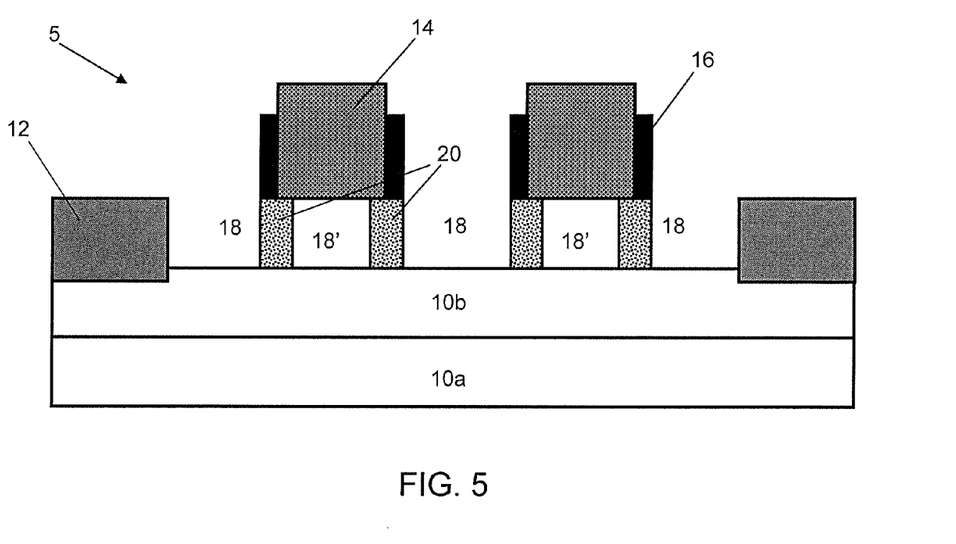

FIG. 5 shows additional processing steps and resultant structure in accordance with aspects of the present invention. As shown in FIG. 5, the silicon islands 18' includes doped regions (first and second doped regions) 20. In embodiments, the doped regions 20 penetrate into the silicon islands 18' on the sides thereof by a predetermined percentage controlled by the dose and energy of the implant and sidewall structures 16. In embodiments, the predetermined percentage is typically less than 10% of the sacrificial structures 14, e.g., to result in under-diffusion of 10% of gate length after annealing. In embodiments, the doped regions 20 penetrate into the silicon islands 18' to a depth that is slightly more than the sidewall structures 16. Also, the spacers 16 are selected to be of such a size that the doped regions 20 are approximately 10 percent of the gate length.

Figure 6:
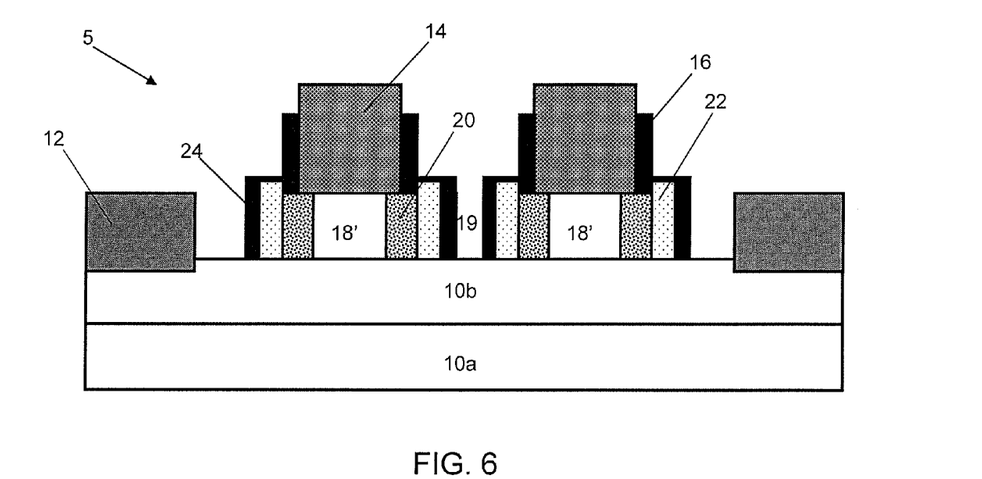

In FIG. 6, SiGe, SiC or Si material 22 is selectively grown on the sides of the silicon islands 18'. In embodiments, SiGe is grown and doped with boron for use with a pFET in order to provide a lower resistance for the FET. In embodiments, a gap 19 is provided between material 22 on adjacent silicon islands 18' to allow additional metal silicide regions 24 to contact over a larger surface area of the material 22; compared to the material 22 being grown to fill the gap (as is contemplated in embodiments). The silicide regions 24 are provided by a metal silicide process. In embodiments, it is advantageous to leave the gap 19 in order to allow a larger contact area for the metal silicide 24, thereby providing a lower resistance of the structure.

Figure 7:
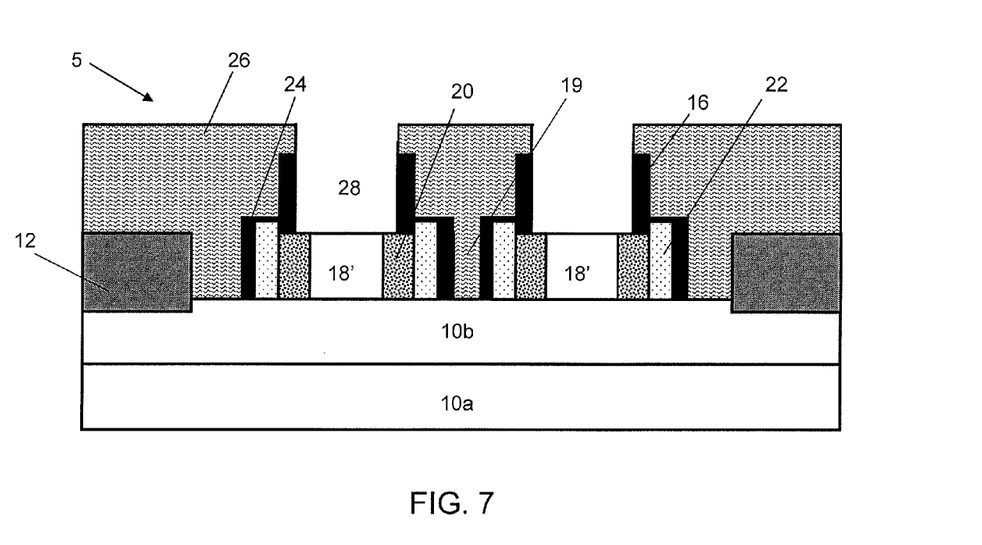

In FIG. 7, an interlevel dielectric layer (ILD) 26 is deposited over the structure. In embodiments, the ILD 26 may be, for example, silicon dioxide ($SiO_2$). After the deposition process, the ILD 26 may be planarized in order to expose top portions of the sacrificial structures 14, e.g., planarized to be coplanar with top surfaces of the sacrificial structures 14. The sacrificial structures 14 are then removed by a selective etch process to form trench structures 28. In embodiments, the sidewall structures 16 or portions thereof may also be removed during the selective etch process.

Figure 8:
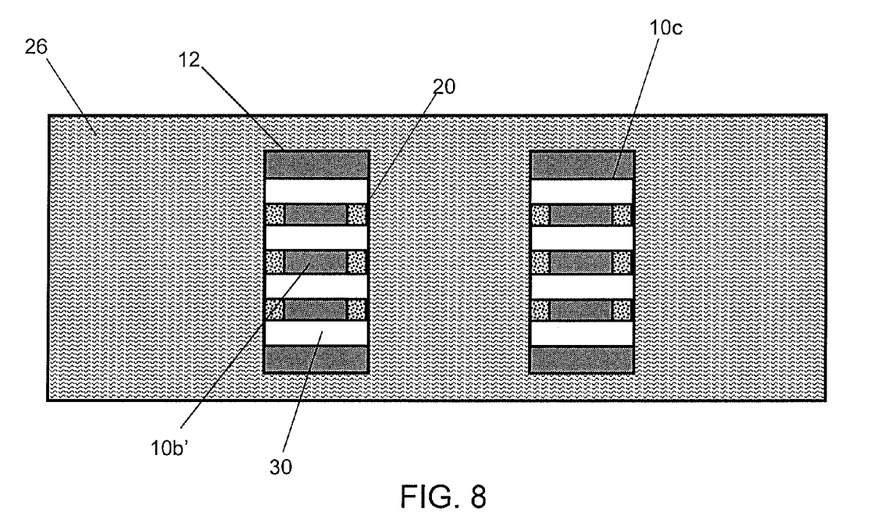

FIG. 8 shows additional processing steps and respective top views of a structure (along different cross sections) in accordance with aspects of the present invention. As shown in FIG. 8, portions of the exposed silicon islands 18' are etched to form discrete fin structures 30, separated from one another. In embodiments, the etching process will remove selective portions of the silicon islands 18' to expose the underlying insulative layer 10b'. In embodiments, the selective removal includes a trench formation to form isolated silicon islands or fin structures 30.

The etching process can be performed by depositing a mask over the silicon islands 18' and patterning the mask to provide openings. The exposed underlying silicon islands 18' will then be etched using, for example, a conventional reactive ion etch (RIE) to form the separate, discrete fin structures 30. In embodiments, the etching process will isolate the fin structures 30 from one another. In embodiments, the etching process will not remove the doped regions 20 on the sides of the remaining discrete fin structures 30 as they are protected by the sidewall structures 16, or a portion thereof. In embodiments, the sidewall structures 16 can be completely removed after the formation of the fin structures 30.

Figure 9:
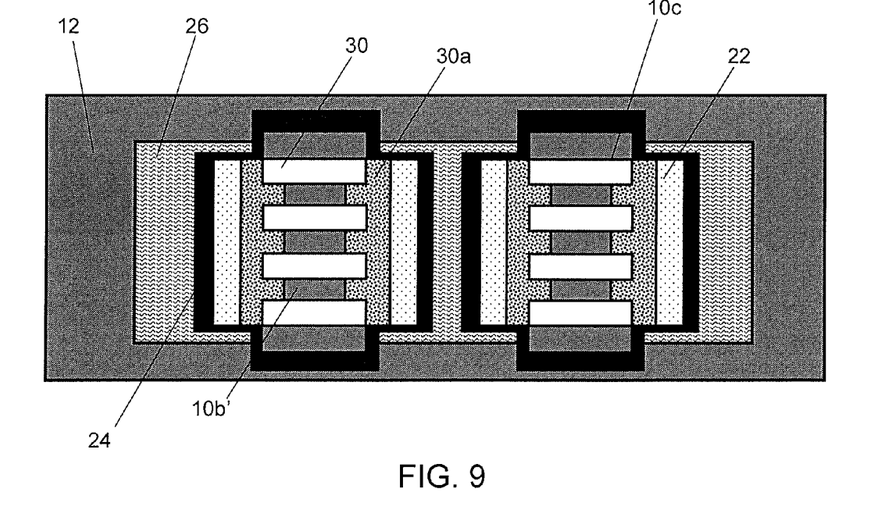

FIG. 9 is a top view of the structure of the present invention prior to the formation of the gate bodies. In embodiments, each of the fin structures 30 is separated by insulator regions 10b'. The fin structures 30 each include a source and drain region 30a which are formed from a single crystalline structure, i.e., doped regions 20. Advantageously, the structure of the present invention will have multiple fin structures 30, with a single crystalline formation. This will provide a low resistance compared to conventional processes. The fin structures 30 are also surrounded by the silicide regions 24 to further reduce resistance.

Figure 10:
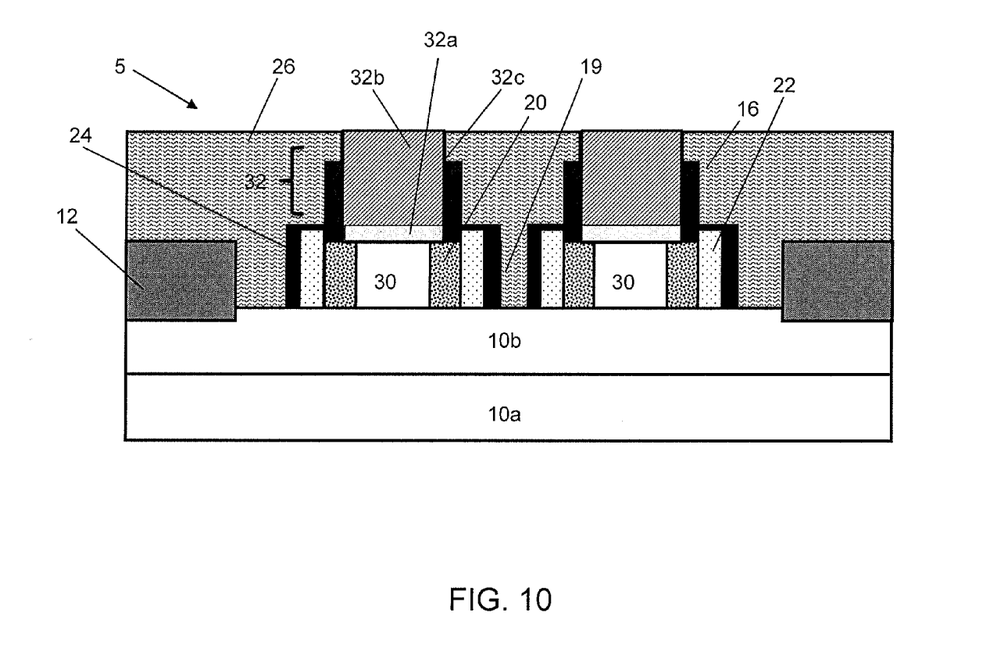

As shown in FIG. 10, gates 32 are formed in the trenches 28 by conventional deposition processes. For example, a dielectric material 32a is deposited on the discrete fin structures 30 (e.g., patterned silicon islands 18'), including the doped regions 20, which now form source and drain regions 30a. The dielectric material 32a can be, for example, a high-K dielectric such as $SiO_2$, followed by a hafnium-based material to form a stacked structure. A gate electrode 32b is deposited over the dielectric layer 32a. In embodiments, the gate electrode 32b may be, for example, a metal or metal stack. In embodiments, the metal can be followed by a deposition of a doped poly. In further embodiments, a dielectric layer 32c can surround the gate electrode 32b.

In FIG. 10, the dielectric layer 32a and the gate electrode 32b can be blanket deposited over the multiple fin structures 30. The dielectric layer 32a and the gate electrode 32b will also be formed over the insulator regions 10b'. In this way, the dielectric layer 32a and the gate electrode 32b, which form the gate structure 32, will extend over the multiple fins structures 30. In embodiments, the source and drain regions 30a will be perpendicular to the length of the gate 32, e.g., at ends of the fin structures 30.

Figure 11:
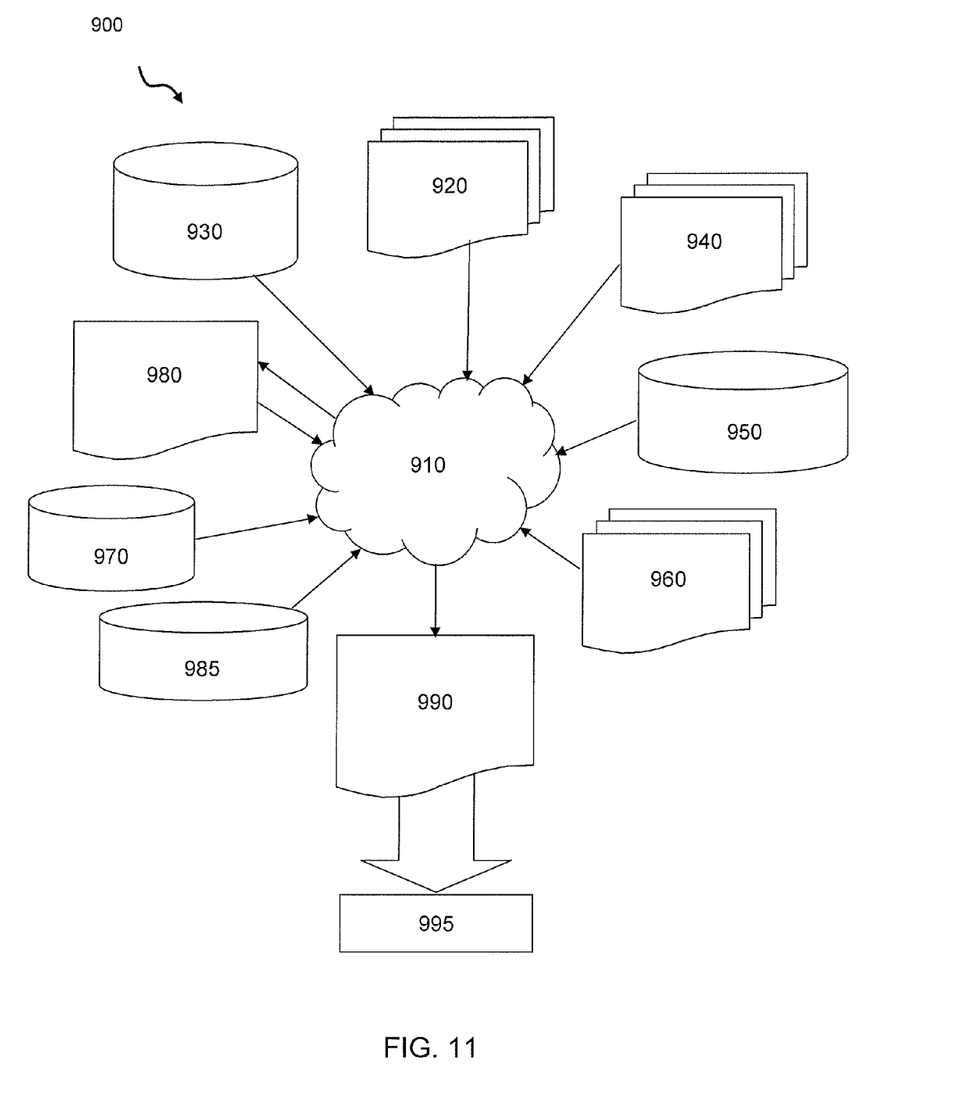
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 2a, 2b, 3, 4a and 4b-10. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2a, 2b, 3, 4a and 4b-10. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2a, 2b, 3, 4a and 4b-10 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2a, 2b, 3, 4a and 4b-10. In one embodiment, design structure 990 may comprise a compiled, executable HDL simulation model that functionally simulates the devices shown in FIGS. 1, 2a, 2b, 3, 4a and 4b-10.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2a, 2b, 3, 4a and 4b-10. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:
1. A structure, comprising:
   a plurality of spaced apart single-crystal silicon fins of substrate material;
   a doped single-crystal silicon source abutting respective first ends of the plurality of spaced apart single-crystal silicon fins;
   a doped single-crystal silicon drain abutting respective second ends of the plurality of spaced apart single-crystal silicon fins;
   sidewall spacers formed on top surfaces of the doped single-crystal silicon source and drain; and
   an epitaxial silicon contact abutting the doped single-crystal silicon source and drain.
2. The structure of claim 1, further including:
   a gate dielectric on sidewalls and top surfaces of the plurality of spaced apart single-crystal silicon fins; and
   a gate electrode on the gate dielectric layer.
3. The structure of claim 1, wherein a dielectric layer and a gate electrode, which form a gate structure, extend over multiple spaced apart single-crystal silicon fins and source and drain regions are perpendicular to a length of the gate structure, at ends of the multiple spaced apart single-crystal silicon fins.

4. The structure of claim 1, wherein the plurality of spaced apart single-crystal silicon fins are perpendicular to an underlying insulator material.

5. A structure, comprising:
- a plurality of discrete spaced apart silicon islands;
- ion-implanted regions abutting opposing ends of each of the plurality of discrete spaced apart silicon islands and which span between adjacent ones of the plurality of discrete spaced apart silicon islands;
- doped Si based sidewall material on side surfaces of the ion implanted regions on the opposing ends of each of the plurality of discrete spaced apart silicon islands;
- silicided regions surrounding the plurality of discrete spaced apart silicon islands and provided on the doped Si based sidewall material;
- sidewall spacers formed on a top surface of the ion-implanted regions;
- a dielectric layer on each of the plurality of discrete spaced apart silicon islands and between the sidewall spacers; and
- gate material on the dielectric layer and between the sidewall spacers.

6. The structure of claim 5, wherein the gate material is gate electrode material on the dielectric material, perpendicular to a length of the plurality of discrete spaced apart silicon islands forming finFETs.

7. The structure of claim 5, wherein the ion-implanted regions penetrate about 10% of a gate length.

8. The structure of claim 7, wherein the doped Si based sidewall material is one of Silicon Germanium SiGe, Silicon Carbon (SiC) and Silicon (Si).

9. The structure of claim 5, wherein the plurality of discrete spaced apart silicon islands are single crystalline doped finFETs.

10. The structure of claim 1, wherein a doped material is provided between each of the plurality of spaced apart single-crystal silicon fins.

11. The structure of claim 1, further comprising a silicided material surrounding the plurality of spaced apart single-crystal silicon fins.

12. The structure of claim 11, wherein the silicided material is provided on doped regions, running perpendicular to the plurality of spaced apart single-crystal silicon fins.

13. The structure of claim 12, wherein the epitaxial silicon is provided between the silicided material and the doped single-crystal silicon source and drain.

14. The structure of claim 13, wherein the epitaxial silicon is one of Silicon Germanium SiGe, Silicon Carbon (SiC) and Silicon (Si).

15. The structure of claim 14, wherein the epitaxial silicon is doped.

16. The structure of claim 1, further comprising:
- a dielectric layer between the sidewall spacers; and
- gate material on the dielectric layer and between the sidewall spacers.

17. The structure of claim 1, wherein:
- the doped single-crystal silicon source spans each of the first ends of the plurality of spaced apart single-crystal silicon fins; and
- the doped single-crystal silicon drain spans each of the plurality of spaced apart single-crystal silicon fins.

* * * * *